US012796359B2

(12) United States Patent
Zhou et al.

(10) Patent No.: US 12,796,359 B2
(45) Date of Patent: Nov. 10, 2026

(54) ETCHING SILICON-CONTAINING MATERIAL AND SILICON-AND-GERMANIUM-CONTAINING MATERIAL

(71) Applicant: Applied Materials, Inc., Santa Clara, CA (US)

(72) Inventors: Yifeng Zhou, Fremont, CA (US); Qian Fu, Pleasanton, CA (US); Li Zhang, Fremont, CA (US); Souvik Chakrabarty, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 342 days.

(21) Appl. No.: 18/667,429

(22) Filed: May 17, 2024

(65) Prior Publication Data

US 2025/0357132 A1 Nov. 20, 2025

(51) Int. Cl.

| | |
|---|---|
| ***H10P 50/24*** | (2026.01) |
| ***H10P 50/00*** | (2026.01) |
| ***H10P 50/26*** | (2026.01) |

(52) U.S. Cl.

CPC .......... *H10P 50/242* (2026.01); *H10P 50/268* (2026.01); *H10P 50/691* (2026.01); *H10P 50/71* (2026.01)

(58) Field of Classification Search

None

See application file for complete search history.

(56) References Cited

U.S. PATENT DOCUMENTS

2014/0220750 A1 8/2014 Sohn et al.
2015/0099368 A1* 4/2015 Shen ................ H01J 37/32192 438/718

(Continued)

FOREIGN PATENT DOCUMENTS

TW 202230453 A 8/2022
TW 202345233 A 11/2023

OTHER PUBLICATIONS

International Application No. PCT/US2025/027745, International Search Report and Written Opinion mailed on Aug. 25, 2025, 9 pages.

(Continued)

*Primary Examiner* — Roberts P Culbert

(74) *Attorney, Agent, or Firm* — Kilpatrick Townsend & Stockton LLP

(57) ABSTRACT

Exemplary semiconductor processing methods may include providing a halogen-containing precursor into a processing region of a semiconductor processing chamber. A substrate may be positioned within the processing region. The substrate may include alternating layers of silicon-containing material and silicon-and-germanium-containing material. The methods may include forming plasma effluents of the halogen-containing precursor. The methods may include contacting the alternating layers of silicon-containing material and silicon-and-germanium-containing material with the plasma effluents of the halogen-containing precursor. The contacting may etch a feature into the alternating layers of silicon-containing material and silicon-and-germanium-containing material. The contacting may be performed at a chamber operating temperature of less than or about 20° C.

20 Claims, 5 Drawing Sheets

(56) References Cited

U.S. PATENT DOCUMENTS

| | | | | |
|---|---|---|---|---|
| 2015/0303069 | A1 | 10/2015 | Narishige et al. | |
| 2017/0162399 | A1 | 6/2017 | Takayama et al. | |
| 2020/0105539 | A1* | 4/2020 | Takahashi | H10P 14/3411 |
| 2021/0057275 | A1 | 2/2021 | Pierreux et al. | |
| 2022/0238344 | A1* | 7/2022 | Luan | H01J 37/32449 |
| 2023/0087266 | A1 | 3/2023 | Heigl | |

OTHER PUBLICATIONS

Taiwanese Application No. 114118059, Office Action mailed on Dec. 23, 2025, 5 pages (4 pages of original document and 1 page of English Translation).

* cited by examiner

ETCHING SILICON-CONTAINING MATERIAL AND SILICON-AND-GERMANIUM-CONTAINING MATERIAL

TECHNICAL FIELD

The present technology relates to semiconductor processes and equipment. More specifically, the present technology relates to etching silicon material and silicon germanium material.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. A wet HF etch preferentially removes silicon oxide over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary semiconductor processing methods may include providing a halogen-containing precursor into a processing region of a semiconductor processing chamber. A substrate may be positioned within the processing region. The substrate may include alternating layers of silicon-containing material and silicon-and-germanium-containing material. The methods may include forming plasma effluents of the halogen-containing precursor. The methods may include contacting the alternating layers of silicon-containing material and silicon-and-germanium-containing material with the plasma effluents of the halogen-containing precursor. The contacting may etch a feature into the alternating layers of silicon-containing material and silicon-and-germanium-containing material. The contacting may be performed at a chamber operating temperature of less than or about 20° C.

In some embodiments, the halogen-containing precursor may be or include a chlorine-containing precursor. The halogen-containing precursor may be or include diatomic chlorine ($Cl_2$) or hydrogen chloride (HCl). The methods may include providing a hydrogen-containing precursor into the processing region with the halogen-containing precursor. The hydrogen-containing precursor may be or include diatomic hydrogen ($H_2$). A flow rate ratio of the halogen-containing precursor relative to the hydrogen-containing precursor may be between about 0.1:1 and about 5:1. The plasma effluents of the halogen-containing precursor may be formed at a source power less than or about 3,000 W. The methods may include applying a bias power while contacting the alternating layers of silicon-containing material and silicon-and-germanium-containing material with the plasma effluents of the halogen-containing precursor. The bias power may be less than or about 2,000 W. The method may be performed at a chamber operating pressure of less than or about 150 mTorr. The method may be performed at a chamber operating temperature of less than or about −20° C.

Some embodiments of the present technology may encompass semiconductor processing methods. The methods may include providing a chlorine-containing precursor and a hydrogen-containing precursor into a processing region of a semiconductor processing chamber. A substrate may be positioned within the processing region. The substrate may include alternating layers of silicon-containing material and silicon-and-germanium-containing material. The methods may include forming plasma effluents of the chlorine-containing precursor and the hydrogen-containing precursor. The methods may include contacting the alternating layers of silicon-containing material and silicon-and-germanium-containing material with the plasma effluents of the chlorine-containing precursor and the hydrogen-containing precursor. The contacting may etch a feature into the alternating layers of silicon-containing material and silicon-and-germanium-containing material. The contacting may be performed at a chamber operating temperature of less than or about 0° C. The methods may include applying a bias power while contacting the alternating layers with the plasma effluents of the chlorine-containing precursor and the hydrogen-containing precursor. The bias power may be less than or about 2,000 W.

In some embodiments, the substrate may further include a mask material defining one or more apertures overlying the alternating layers of silicon-containing material and silicon-and-germanium-containing material. A flow rate of the chlorine-containing precursor may be less than or about 1,500 sccm. The methods may include pulsing the bias power while contacting the alternating layers of silicon-containing material and silicon-and-germanium-containing material with the plasma effluents of the chlorine-containing precursor and the hydrogen-containing precursor. The bias power may be pulsed at a duty cycle of less than or about 70% and a frequency of less than or about 1,000 Hz.

Some embodiments of the present technology may encompass semiconductor processing methods. The methods may include providing a chlorine-containing precursor and a hydrogen-containing precursor into a processing region of a semiconductor processing chamber. A substrate may be positioned within the processing region. The substrate may include alternating layers of silicon-containing material and silicon-and-germanium-containing material. A flow rate ratio of the chlorine-containing precursor relative to the hydrogen-containing precursor may be between about 0.2:1 and about 4:1. The methods may include forming plasma effluents of the chlorine-containing precursor and the hydrogen-containing precursor at a source power less than or about 2,000 W. The methods may include contacting the alternating layers of silicon-containing material and silicon-and-germanium-containing material with the plasma effluents of the chlorine-containing precursor and the hydrogen-containing precursor. The contacting may etch a feature into the alternating layers of silicon-containing material and silicon-and-germanium-containing material. The contacting may be performed at a chamber operating temperature of less than or about −20° C. The methods may include applying a bias power while contacting the alternating layers of silicon-containing material and silicon-and-germanium-containing material with the plasma effluents of the chlorine-containing precursor and the hydrogen-containing precursor.

In some embodiments, the chlorine-containing precursor may be or include diatomic chlorine ($Cl_2$). The hydrogen-containing precursor may be or include diatomic hydrogen ($H_2$). The methods may include pulsing the source power and the bias power while contacting the alternating layers of silicon-containing material and silicon-and-germanium-containing material with the plasma effluents of the chlorine-containing precursor and the hydrogen-containing precursor. The contacting may be performed at a chamber operating temperature of less than or about −50° C.

Such technology may provide numerous benefits over conventional systems and techniques. For example, the processes may etch layers including alternating layers of silicon and silicon germanium within semiconductor structures. Additionally, the processes may etch materials in a single-step without requiring intermediate passivation operations, which may allow for a much straighter etch profile into the alternating layers of silicon and silicon germanium. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
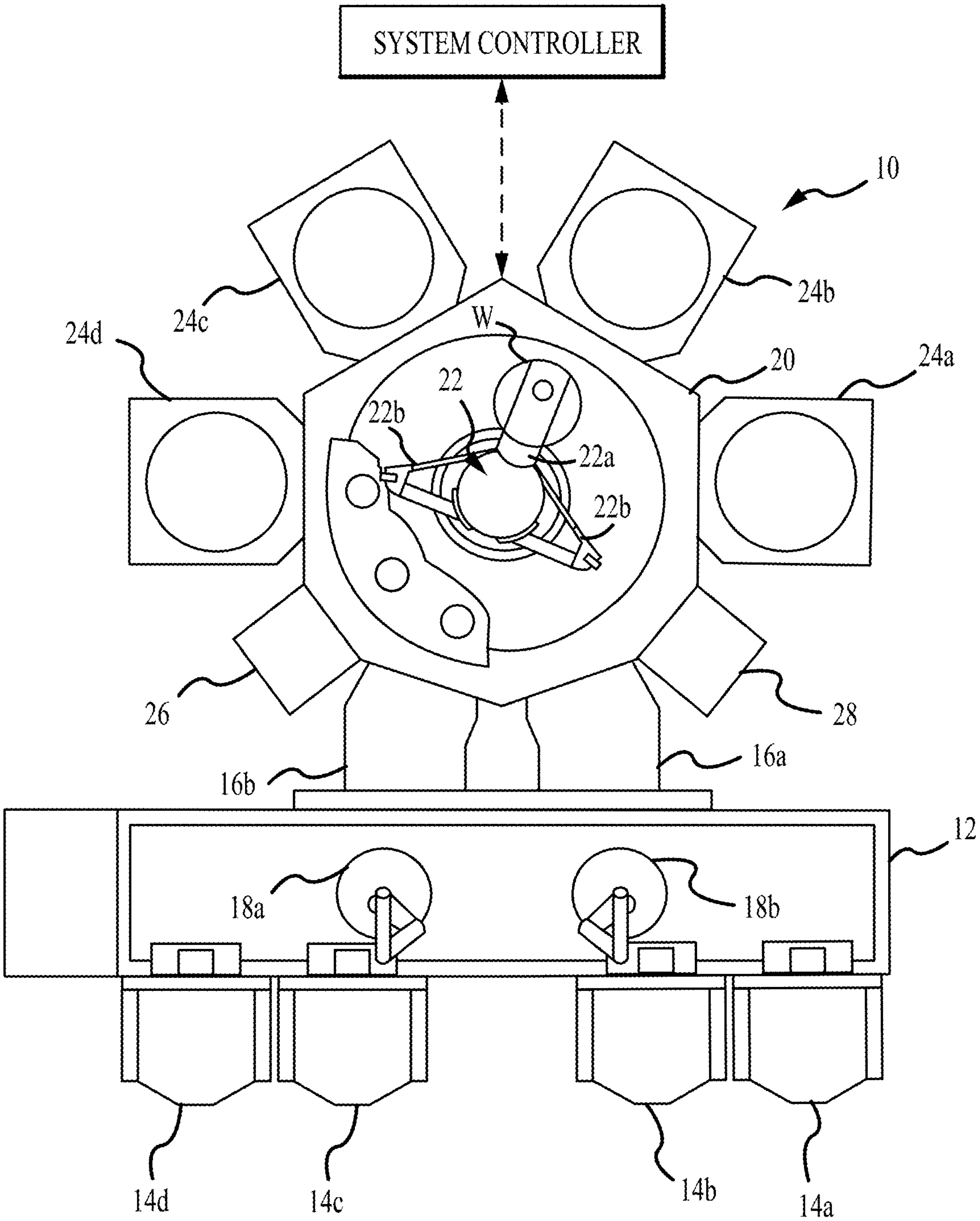
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

In transitioning from 2D devices to 3D devices, many process operations are modified from vertical to horizontal operations. Additionally, as 3D device structures grow in the number of features, such as cells, being formed, the aspect ratios of holes, trenches, and other structures increase, sometimes dramatically. During such processing, layers of a first material and a second material may form a stack of materials on a substrate. These layers may have a variety of operations performed to place structures before partially or fully removing one of the materials and replacing it with other materials. For example, one or more holes or trenches may be etched into alternating layers of the first material and the second material prior to recessing or removing the second material to make way for one or more other materials.

Many conventional technologies utilize an etch process that passivates sidewalls of the holes or trenches. By passivating the sidewalls, a uniform profile of the holes or trenches may be maintained, and lateral etching may be minimized. However, formation of the passivation material on the sidewalls, which may be a polymeric material, may not be uniform throughout a depth of the hole or trench. Accordingly, conventional technologies may suffer from pattern loading and/or bending. Other conventional technologies may perform a looped process using oxidation to passivate sidewalls of the holes or trenches being etched followed by etching. However, these technologies suffer from kinking in the sidewalls that also lead to tapering of the holes or feature being etched.

The present technology overcomes these issues by performing an etch process using a single exposure to a halogen-containing precursor and, optionally, a hydrogen-containing precursor. The etch process may be performed at a low temperature that increases directionality of the etch and condensation of passivation material, thereby obviating the need for polymeric passivation material. Due to the high directionality of the one-step etch, issues with hole or trench profile are reduced and/or eliminated. Additionally, the need for multiple different operations, such as passivation and subsequent etching, on a cyclic basis are avoided.

Although the remaining disclosure will routinely identify specific etching processes utilizing the disclosed technology, it will be readily understood that the systems and methods are equally applicable to deposition and cleaning processes as may occur in the described chambers. Accordingly, the technology should not be considered to be so limited as for use with etching processes or chambers alone. Moreover, although an exemplary chamber is described to provide foundation for the present technology, it is to be understood that the present technology can be applied to virtually any semiconductor processing chamber that may allow the single-chamber operations described.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24*a-d*, a transfer chamber 20, a service chamber 26, an integrated metrology chamber 28, and a pair of load lock chambers 16*a-b*. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22*a* attached to the distal ends of extendible arms 22*b*, respectively. The blades 22*a* may be used for carrying individual substrates to and from the process chambers. In operation, one of the substrate transport blades such as blade 22*a* of the transport mechanism 22 may retrieve a substrate W from one of the load lock chambers such as chambers 16*a-b* and carry substrate W to a first stage of processing, for example, a treatment process as described below in chambers 24*a-d*. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22*a* and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16*a-b*. From the load lock chambers 16*a-b*, the substrate may move into a factory interface 12. The factory interface 12 generally may operate to transfer substrates between pod loaders 14*a-d* in an atmospheric pressure clean environment and the load lock chambers 16*a-b*. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18*a-b*, may be positioned in factory interface 12 to transport substrates between various positions/locations within factory interface 12 and to other locations in communication therewith. Robots 18*a-b* may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24*a-d* may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
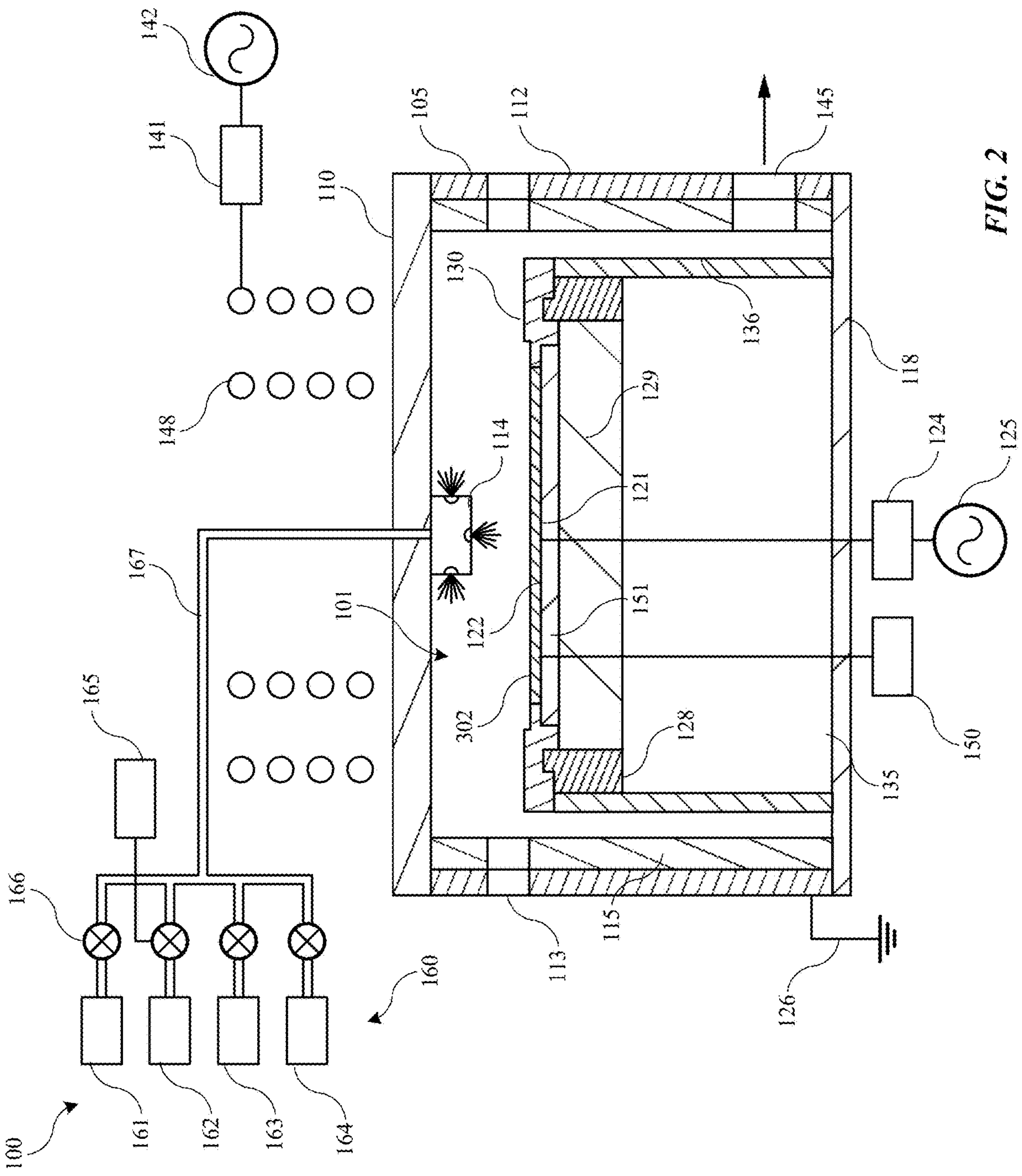
FIG. 2 shows a schematic cross-sectional view of an exemplary processing chamber according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $H_2$, $NH_3$, $H_2O$, $H_2O_2$, $NF_3$, HF, $F_2$, $CF_4$, $CHF_3$, $C_2F_6$, $C_2F_4$, $C_3F_6$, $C_4F_6$, $C_4F_8$, $BrF_3$, $ClF_3$, $SF_6$, $CH_3F$, $CH_2F_2$, $BC_{13}$, $PF_3$, $PH_3$, $C_{12}$, HCl, COS, and $SO_2$, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck ("ESC") 122 for holding the substrate 302 during processing. The electrostatic chuck 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 500 volts to about 15,000 volts to the electrode 121. The power source 150 may also include a system controller for controlling the operation of the electrode 121 by directing a DC current to the electrode 121 for chucking and de-chucking the substrate 302. For example, similar to the RF power supply 125, power supply 150 may provide a bias which attracts plasma ions, formed by the process gases in the chamber volume 101, to the ESC 122 and substrate 302 seated on the pedestal. The power supply 150 may cycle on and off, or pulse, during processing of the substrate 302. In embodiments, the power supply 150 may supply RF power, DC current or voltage for chucking and/or bias, or a combination thereof. In additional embodiments, multiple power supplies may be configured to supply RF power and DC current or voltage for chucking and/or bias. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabricated on the substrate 302. For example, the ESC 122 may be configured to maintain the substrate 302 at a temperature of about −150° C. or lower to about 500° C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 3:
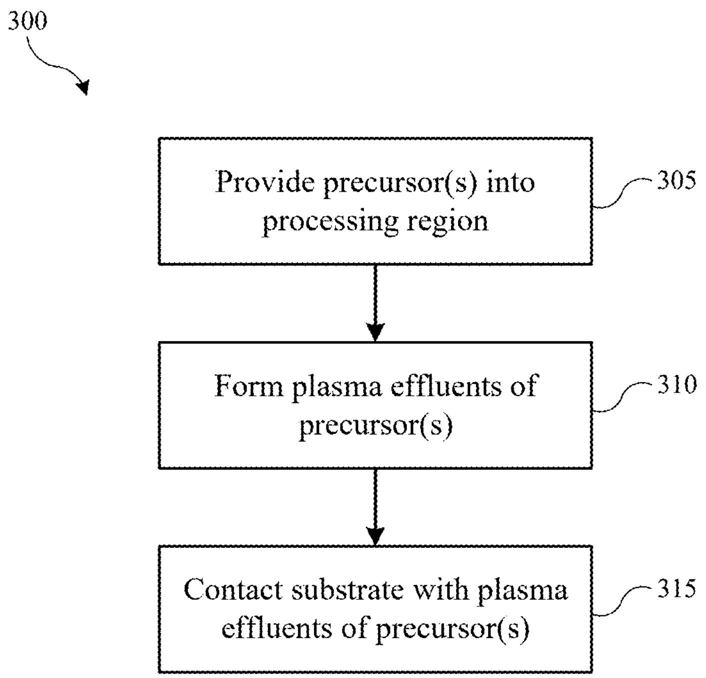
FIG. 3 shows exemplary operations in a method according to some embodiments of the present technology.

The chamber discussed previously may be used in performing exemplary methods, including etching methods, although any number of chambers may be configured to perform one or more aspects used in embodiments of the present technology. Turning to FIG. 3, exemplary operations in a method 300 according to embodiments of the present technology are shown. Method 300 may include one or more operations prior to the initiation of the method, including front end processing, deposition, etching, polishing, cleaning, or any other operations that may be performed prior to the described operations. The methods may include a number of optional operations, which may or may not be specifically associated with some embodiments of methods, according to embodiments of the present technology. For example, many of the operations are described in order to provide a broader scope of the processes performed, but are not critical to the technology, or may be performed by alternative methodology as will be discussed further below. Method 300 may describe operations shown schematically in FIGS. 4A-4D, the illustrations of which will be described in conjunction with the operations of method 300. It is to be understood that the figures illustrate only partial schematic views, and a substrate may contain any number of additional materials and features having a variety of characteristics and aspects as illustrated in the figures.

Figure 4A:
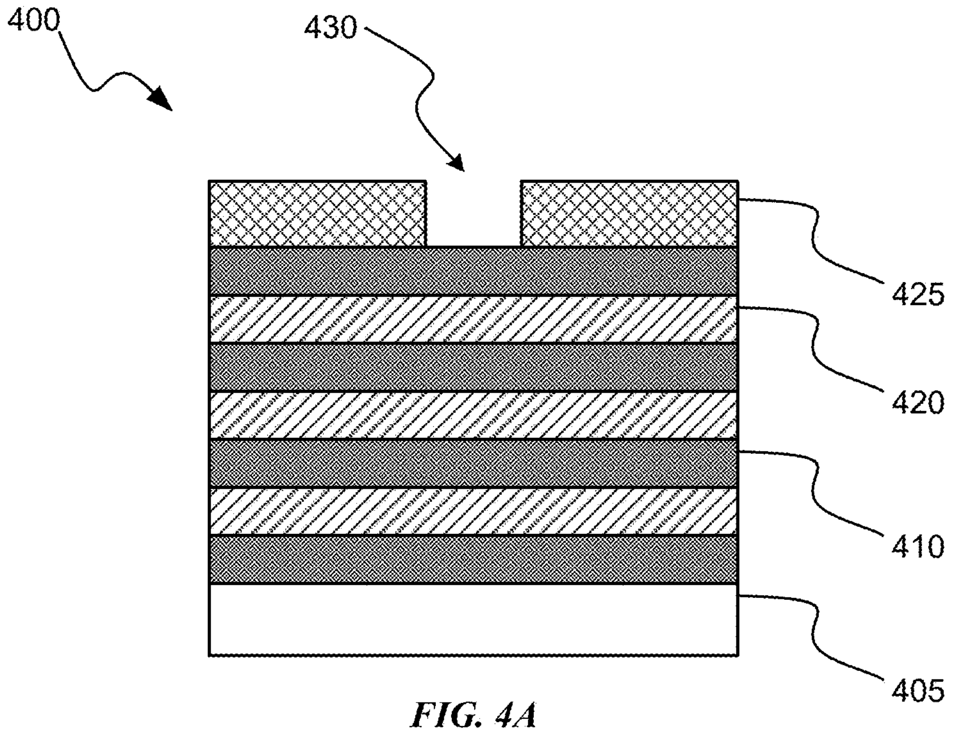
FIGS. 4A-4D show cross-sectional views of substrates being processed according to some embodiments of the present technology.

Method 300 may or may not involve optional operations to develop the semiconductor structure to a particular fabrication operation. It is to be understood that method 300 may be performed on any number of semiconductor structures 400 or substrates 405, as illustrated in FIG. 4A, including exemplary structures on which etching of alternating layers of silicon-containing material and silicon-and-germanium-containing material be performed. As illustrated in FIG. 4A, substrate 405 may have a plurality of stacked alternating layers overlying the substrate 405, which may be a silicon, silicon germanium, or other substrate materials. The stacked alternating layers may include silicon-containing material 410, which may be silicon or polysilicon, alternating with silicon-and-germanium-containing material 420, which may be silicon germanium, for example. The silicon-and-germanium-containing material 420 may be or include material that may be at least partially removed to produce device structures in subsequent operations. Although the remaining disclosure will discuss silicon and silicon germanium layers, any other known materials used in these two layers may be substituted for one or more of the layers. Although illustrated with only 7 layers of material, exemplary structures may include any of the numbers of layers including hundreds of layers of material, and it is to be understood that the figures are only schematics to illustrate aspects of the present technology. Although illustrated as substantially equal thicknesses, exemplary structures may include individual layers characterized by various thicknesses. Additionally, to allow for one or more holes or trenches to be formed through the layers, a mask material 425 may be formed on the alternating layers of the silicon-containing material 410 and the silicon-and-germanium-containing material 420. The mask material 425 may be patterned to form one or more apertures 430, exposing a portion the underlying layers. Although only a single aperture 430 is illustrated, it is to be understood that exemplary structure 400 may include any number of apertures 430 across the substrate 405. Some or all of these operations may be performed in chambers or system tools as previously described, or may be performed in different chambers on the same system tool, which may include the chamber in which the operations of method 300 are performed.

Figure 4B:
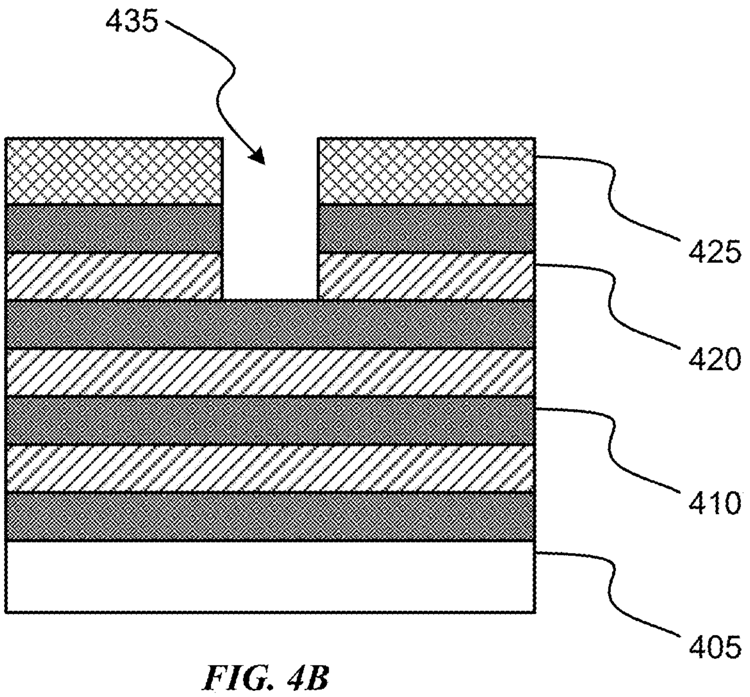

Method 300 may be performed to etch or otherwise remove portions of the silicon-containing material 410 and the silicon-and-germanium-containing material 420, which may form memory or trenches in the structure 400 as illustrated. The method may be performed to facilitate control of the profile through the structure, and improve etch characteristics, such as uniformity of the holes or trenches as the etch progresses into the alternating layers. Method 300 may include flowing a halogen-containing precursor and, optionally, a hydrogen-containing precursor into a processing region of the semiconductor processing chamber in which the substrate is maintained at operation 305. Plasma effluents of the halogen-containing precursor and, if present, the hydrogen-containing precursor may be formed at operation 310. As illustrated in FIG. 4B, the plasma effluents of the halogen-containing precursor and, if present, the hydrogen-containing precursor may contact the substrate at operation 315, and may etch into the alternating layers of silicon-containing material 410 and silicon-and-germanium-containing material 420. Etching into the alternating layers of silicon-containing material 410 and silicon-and-germanium-containing material 420 may begin to form a feature, such as a hole or trench 435, in the alternating layers. The hole or trench 435 may be in alignment with the aperture 430 in the mask material 525. Again, although only a single hole or trench 435 is illustrated, it is to be understood that exemplary structure 400 may include any number of holes or trenches across the substrate 405.

Figure 4C:
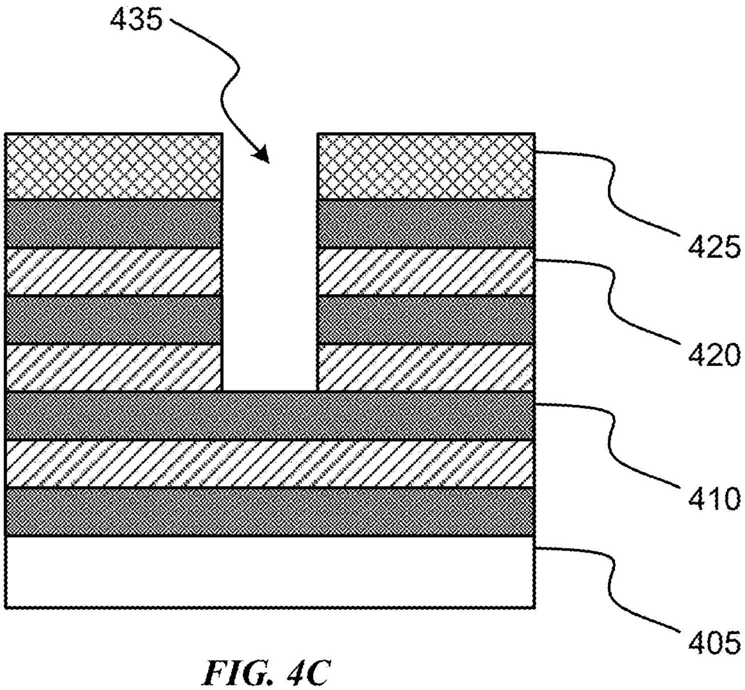
Figure 4D:
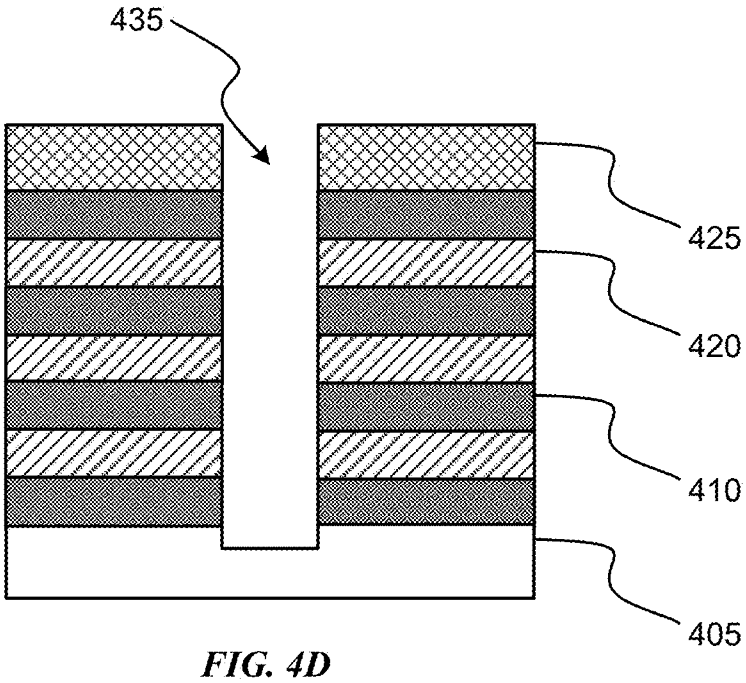

As illustrated in FIGS. 4C-4D, the contacting at operation 315 of method 300 may be continued for a period of time to etch a desired depth into the alternating layers and/or the substrate 405. While the hole or trench 435 is illustrated as extending, it is contemplated that the etch may be halted at any depth depending on the desired structure.

The halogen-containing precursor flowed at operation 305 may include a chlorine-containing precursors, a fluorine-containing precursor, or any other halogen-containing precursor that may etch silicon-containing material. For example, the halogen-containing precursor may be or include hydrogen chloride (HCl), nitrogen trichloride ($NCl_3$), diatomic chlorine ($Cl_2$), bromine monochloride (BrCl), chlorine trifluoride ($ClF_3$), sulfur dichloride ($SCl_2$), xenon dichloride ($XeCl_2$), hydrogen fluoride (HF), nitrogen trifluoride ($NF_3$), diatomic fluorine ($F_2$), bromine pentafluoride (BrFs), sulfur hexafluoride ($SF_6$), xenon difluoride ($XeF_2$), or any other halogen-containing precursor used or useful in semiconductor processing. In some embodiments, the halogen-containing precursor may be HCl and/or $Cl_2$. Hydrogen-containing precursors flowed at operation 305, if present, may include diatomic hydrogen ($H_2$), ammonia ($NH_3$), steam ($H_2O$), methane ($CH_4$), or any other hydrogen-containing precursor used or useful in semiconductor processing. The halogen-containing precursor and, if present, the hydrogen-containing precursor may also be flowed with any number of additional precursors or carrier gases including nitrogen, argon, helium, or any number of additional materials, although in some embodiments the precursors may be limited to control side reactions or other aspects that may impact the fluorination. The additional precursors or carrier gases may be provided for dilution and/or distribution of the halogen-containing precursor and, if present, the hydrogen-containing precursor.

A flow rate ratio of the halogen-containing precursor relative to the hydrogen-containing precursor, when present, may be adjusted to control the amount of halogen and/or hydrogen radicals and resultant etch of the alternating layers of the silicon-containing material 410 and silicon-and-germanium-containing material 420 as well as passivation of sidewalls of the hole or trench 435 being etched. At increased flow rate ratios of the halogen-containing precursor relative to the hydrogen-containing precursor, abundant halogen radicals may be present and the etch rate may increase. However, at too high of flow rate ratios of the halogen-containing precursor relative to the hydrogen-containing precursor, lateral etching may begin and issues with controlling/maintaining the profile of the hole or trench 435 may begin. Conversely, at too low of flow rate ratios of the halogen-containing precursor relative to the hydrogen-containing precursor, passivation from the hydrogen-containing precursor may be so strong that the etching slows and/or halts. Further, the increased passivation may result in undesirable tapering of the hole or trench 435 being etched into the alternating layers of the silicon-containing material 410 and silicon-and-germanium-containing material 420.

As such, the flow rate ratio of the halogen-containing precursor relative to the hydrogen-containing precursor may be greater than or about 0.1:1, and may be greater than or about 0.2:1, greater than or about 0.3:1, greater than or about 0.4:1, greater than or about 0.5:1, greater than or about 0.6:1, greater than or about 0.7:1, greater than or about 0.8:1, greater than or about 0.9:1, greater than or about 1:1, greater than or about 1.5:1, greater than or about 2:1, greater than or about 2.5:1, greater than or about 3:1, greater than or about 3.5:1, greater than or about 4:1, greater than or about 4.5:1, or more. Conversely, the flow rate ratio of the halogen-containing precursor relative to the hydrogen-containing precursor may be less than or about 10:1, and may be less than or about 9:1, less than or about 8:1, less than or about 7.5:1, less than or about 7:1, less than or about 6.5:1, less than or about 6:1, less than or about 5.5:1, less than or about 5:1, less than or about 4.5:1, less than or about 4:1, less than or about 3.5:1, less than or about 3:1, less than or about 2.5:1, or less. It is also contemplated that the flow rate ratio may be adjusted during method 300, such that the etch rate and amount of passivation are adjusted as the hole or trench 435 is etched into the alternating layers of the silicon-containing material 410 and silicon-and-germanium-containing material 420.

The flow rate of the fluorine-containing precursor may be less than or about 1,500 sccm, and may be less than or about 1,400 sccm, less than or about 1,300 sccm, less than or about 1,200 sccm, less than or about 1,100 sccm, less than or about 1,000 sccm, less than or about 900 sccm, less than or about 800 sccm, less than or about 750 sccm, less than or about 700 sccm, less than or about 650 sccm, less than or about 600 sccm, less than or about 575 sccm, less than or about 550 sccm, less than or about 525 sccm, less than or about 500 sccm, less than or about 475 sccm, less than or about 450 sccm, or less. At flow rates greater than, for example, 1,500 sccm, excessive halogen material may be present and may result in excessive etching. For example, excessive halogen material may result in lateral etching that may impact uniformity of the hole or trench 435 being etched.

As previously discussed, a carrier gas may be provided to distribute and/or dilute the halogen-containing precursor and, if present, the hydrogen-containing precursor. A flow rate of the carrier gas may be greater than or about 50 sccm, and may be greater than or about 100 sccm, greater than or about 150 sccm, greater than or about 200 sccm, greater than or about 250 sccm, or more.

The source power used to form plasma effluents of the halogen-containing precursor and, if present, the hydrogen-containing precursor may be a relatively low plasma power. At higher plasma powers, increased halogen radicals may be present, and lateral etch rate may increase. Accordingly, lower plasma powers may reduce the radical density and maintain control of the etching. As such, the plasma effluents of the halogen-containing precursor and, if present, the hydrogen-containing precursor may be formed at less than or about 3,000 W, and may be formed at less than or about 2,750 W, less than or about 2,500 W, less than or about 2,250 W, less than or about 2,000 W, less than or about 1,750 W, less than or about 1,500 W, less than or about 1,400 W, less than or about 1,300 W, less than or about 1,250 W, less than or about 1,200 W, less than or about 1,100 W, less than or about 1,000 W, less than or about 900 W, less than or about 800 W, less than or about 750 W, less than or about 700 W, less than or about 650 W, less than or about 600 W, less than or about 550 W, less than or about 500 W, less than or about 475 W, less than or about 450 W, less than or about 425 W, less than or about 400 W, less than or about 375 W, less than or about 350 W, or less. However, very low plasma powers may result in low plasma density. Therefore, the plasma effluents of the halogen-containing precursor and, if present, the hydrogen-containing precursor may be formed at greater than or about 50 W, and may be formed at greater than or about 100 W, greater than or about 150 W, greater than or about 200 W, greater than or about 250 W, greater than or about 300 W, or more.

While forming the plasma effluents of the halogen-containing precursor and, if present, the hydrogen-containing precursor at operation 310 and/or while contacting the alternating layers of silicon-containing material 410 and silicon-and-germanium-containing material 420 with the plasma effluents of the inert precursor at operation 315, a bias power may be applied. The bias power, which may be a 2 MHz frequency applied to the pedestal or substrate support, may increase directionality of the plasma effluents of the halogen-containing precursor and, if present, the hydrogen-containing precursor. The increased directionality may draw the plasma effluents of the halogen-containing precursor and, if present, the hydrogen-containing precursor to the alternating layers of silicon-containing material 410 and silicon-and-germanium-containing material 420. Accordingly, the plasma effluents of the halogen-containing precursor and, if present, the hydrogen-containing precursor may bombard and remove the silicon-containing material 410 and silicon-and-germanium-containing material 420. In embodiments, the bias power applied may be greater than or about 250 W, and may be formed at greater than or about 300 W, greater than or about 350 W, greater than or about 400 W, greater than or about 450 W, greater than or about 500 W, greater than or about 550 W, greater than or about 600 W, greater than or about 650 W, greater than or about 700 W, greater than or about 750 W, or more. However, at higher bias powers, the bombardment may increase and materials on substrate 405 or in structure 400 may begin to sputter. Accordingly, the bias power applied may be less than or about 2,000 W, and may be formed at less than or about 1,750 W, less than or about 1,500 W, less than or about 1,250 W, less than or about 1,000 W, less than or about 900 W, less than or about 800 W, less than or about 750 W, less than or about 725 W, less than or about 700 W, less than or about 675 W, less than or about 650 W, or less.

To reduce the effective source power and/or bias power, method 300 may include pulsing the source power and/or the bias power while forming the plasma effluents of the halogen-containing precursor and, if present, the hydrogen-containing precursor at operation 310 and/or while contacting the alternating layers of silicon-containing material 410 and silicon-and-germanium-containing material 420 with the plasma effluents of the inert precursor at operation 315. Pulsing the source power and/or the bias power may reduce the plasma density and increase control of the hole or trench 435 being etched into the alternating layers of silicon-containing material 410 and silicon-and-germanium-containing material 420. In embodiments, the bias power and the source power may be pulsed together although it is contemplated that the source power may alternatively be continuous while only the bias power is pulsed.

In embodiments, the source power and/or the bias power may be pulsed at a duty cycle of less than or about 95%, and may be pulsed at a duty cycle of less than or about 90%, less than or about 85%, less than or about 80%, less than or about 75%, less than or about 70%, less than or about 65%, less than or about 60%, less than or about 55%, less than or about 50%, less than or about 45%, less than or about 40%, less than or about 35%, less than or about 30%, less than or about 25%, less than or about 20%, or less. The duty cycle may be dependent on one or more other factors, such as flow rates, flow rate ratios, source powers, etc. A frequency of the pulsing may be less than or about 1,000 Hz, and may be less than or about 750 Hz, less than or about 500 Hz, less than or about 400 Hz, less than 0 about 300 Hz, less than or about 250 Hz, less than or about 200 Hz, less than or about 175 Hz, less than or about 150 Hz, less than or about 125 Hz, less than or about 100 Hz, or less.

In embodiments, a depth of hole or trench 435 may be selected based on device need. However, the present technology may be capable of etching a uniform profile in a hole or trench 435 extending through alternating layers of silicon-containing material 410 and silicon-and-germanium-containing material 420 at a depth of greater than or about 50 nm, and greater than or about 75 nm, greater than or about 100 nm, greater than or about 125 nm, greater than or about 150 nm, greater than or about 175 nm, greater than or about 200 nm, or more. As previously discussed, the etching may continue through all or a portion of the alternating layers of silicon-containing material 410 and silicon-and-germanium-containing material 420 and may even extend into substrate 405.

Process conditions may also impact the operations performed in method 300. Each of the operations of method 300 may be performed during a constant temperature in embodiments, while in some embodiments the temperature may be adjusted during different operations. Temperatures may be maintained in any range, however, at lower temperatures, the precursors may condense to a liquid and passivate the sidewalls of the hole or trench 435 to increase the uniformity and straightness of the profile being etched. Accordingly, in some embodiments any or all operations of the method 300 may performed at a chamber operating temperature of less than or about 20° C., and may be performed at a chamber operating temperature of less than or about 10° C., less than or about 0° C., less than or about −10° C., less than or about −20° C., less than or about −30° C., less than or about −40° C., less than or about −50° C., less than or about −60° C., less than or about −70° C., less than or about −80° C., less than or about −90° C., or less.

Each of the operations of method 300 may be performed during a constant pressure in embodiments, while in some embodiments the pressure may be adjusted during different operations. Pressures may be maintained in any range, however, at higher pressures, further dissociation of the halogen-containing precursors may occur, which may produce more halogen radicals. As the amount of halogen radicals increases, directionality of the etch may decrease and the profile of the hole or trench 435 may suffer. Accordingly, in some embodiments any or all operations of the method 300 may performed at a chamber operating pressure of greater than or about 5 m Torr, and may be performed at a chamber operating pressure of greater than or about 10 m Torr, greater than or about 15 m Torr, greater than or about 20 mTorr, greater than or about 25 m Torr, greater than or about 30 m Torr, greater than or about 35 m Torr, greater than or about 40 m Torr, greater than or about 45 m Torr, greater than or about 50 mTorr, greater than or about 60 m Torr, greater than or about 70 mTorr, or more. Conversely, at lower pressures, directionality of the etch may increase as well as ion energy and etch amount per cycle. Therefore, any or all operations of the method 300 may performed at a chamber operating pressure of less than or about 150 m Torr, and may be performed at a chamber operating pressure of less than or about 140 m Torr, less than or about 130 m Torr, less than or about 120 mTorr, less than or about 110 m Torr, less than or about 100 m Torr, less than or about 90 mTorr, less than or about 80 m Torr, less than or about 70 m Torr, less than or about 60 m Torr, less than or about 50 m Torr, or less.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms “a”, “an”, and “the” include plural references unless the context clearly dictates otherwise. Thus, for example, reference to “a precursor” includes a plurality of such precursors, and reference to “the layer” includes reference to one or more layers and equivalents thereof known to those skilled in the art, and so forth.

Also, the words “comprise(s)”, “comprising”, “contain(s)”, “containing”, “include(s)”, and “including”, when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:

providing a halogen-containing precursor into a processing region of a semiconductor processing chamber, wherein a substrate is positioned within the processing region, and wherein the substrate comprises alternating layers of silicon-containing material and silicon-and-germanium-containing material;

forming plasma effluents of the halogen-containing precursor; and contacting the alternating layers of silicon-containing material and silicon-and-germanium-containing material with the plasma effluents of the halogen-containing precursor, wherein the contacting etches a feature into the alternating layers of silicon-containing material and silicon-and-germanium-containing material, and wherein the contacting is performed at a chamber operating temperature of less than or about 20° C.

2. The semiconductor processing method of claim 1, wherein the halogen-containing precursor comprises a chlorine-containing precursor.

3. The semiconductor processing method of claim 1, wherein the halogen-containing precursor comprises diatomic chlorine ($Cl_2$) or hydrogen chloride (HCl).

4. The semiconductor processing method of claim 1, further comprising:

providing a hydrogen-containing precursor into the processing region with the halogen-containing precursor.

5. The semiconductor processing method of claim 4, wherein the hydrogen-containing precursor comprises diatomic hydrogen ($H_2$).

6. The semiconductor processing method of claim 4, wherein a flow rate ratio of the halogen-containing precursor relative to the hydrogen-containing precursor is between about 0.1:1 and about 5:1.

7. The semiconductor processing method of claim 1, wherein the plasma effluents of the halogen-containing precursor are formed at a source power less than or about 3,000 W.

8. The semiconductor processing method of claim 1, further comprising:

applying a bias power while contacting the alternating layers of silicon-containing material and silicon-and-germanium-containing material with the plasma effluents of the halogen-containing precursor.

9. The semiconductor processing method of claim 8, wherein the bias power is less than or about 2,000 W.

10. The semiconductor processing method of claim 1, wherein the method is performed at a chamber operating pressure of less than or about 150 mTorr.

11. The semiconductor processing method of claim 1, wherein the method is performed at a chamber operating temperature of less than or about −20° C.

12. A semiconductor processing method comprising:

providing a chlorine-containing precursor and a hydrogen-containing precursor into a processing region of a semiconductor processing chamber, wherein a substrate is positioned within the processing region, and wherein the substrate comprises alternating layers of silicon-containing material and silicon-and-germanium-containing material;

forming plasma effluents of the chlorine-containing precursor and the hydrogen-containing precursor;

contacting the alternating layers of silicon-containing material and silicon-and-germanium-containing material with the plasma effluents of the chlorine-containing precursor and the hydrogen-containing precursor, wherein the contacting etches a feature into the alternating layers of silicon-containing material and silicon-and-germanium-containing material, and wherein the contacting is performed at a chamber operating temperature of less than or about 0° C.; and applying a bias power while contacting the alternating layers with the plasma effluents of the chlorine-containing precursor and the hydrogen-containing precursor, wherein the bias power is less than or about 2,000 W.

13. The semiconductor processing method of claim 12, wherein the substrate further comprises a mask material defining one or more apertures overlying the alternating layers of silicon-containing material and silicon-and-germanium-containing material.

14. The semiconductor processing method of claim 12, wherein a flow rate of the chlorine-containing precursor is less than or about 1,500 sccm.

15. The semiconductor processing method of claim 12, further comprising:

pulsing the bias power while contacting the alternating layers of silicon-containing material and silicon-and-germanium-containing material with the plasma effluents of the chlorine-containing precursor and the hydrogen-containing precursor.

16. The semiconductor processing method of claim 12, wherein the bias power is pulsed at a duty cycle of less than or about 70% and a frequency of less than or about 1,000 Hz.

17. A semiconductor processing method comprising:

providing a chlorine-containing precursor and a hydrogen-containing precursor into a processing region of a semiconductor processing chamber, wherein a substrate is positioned within the processing region, wherein the substrate comprises alternating layers of silicon-containing material and silicon-and-germanium-containing material, and wherein a flow rate ratio of the chlorine-containing precursor relative to the hydrogen-containing precursor is between about 0.2:1 and about 4:1;

forming plasma effluents of the chlorine-containing precursor and the hydrogen-containing precursor at a source power less than or about 2,000 W;

contacting the alternating layers of silicon-containing material and silicon-and-germanium-containing material with the plasma effluents of the chlorine-containing precursor and the hydrogen-containing precursor, wherein the contacting etches a feature into the alternating layers of silicon-containing material and silicon-and-germanium-containing material, and wherein the contacting is performed at a chamber operating temperature of less than or about −20° C.; and applying a bias power while contacting the alternating layers of silicon-containing material and silicon-and-germanium-containing material with the plasma effluents of the chlorine-containing precursor and the hydrogen-containing precursor.

18. The semiconductor processing method of claim 17, wherein the chlorine-containing precursor comprises diatomic chlorine ($Cl_2$) and the hydrogen-containing precursor comprises diatomic hydrogen ($H_2$).

19. The semiconductor processing method of claim 17, further comprising:

pulsing the source power and the bias power while contacting the alternating layers of silicon-containing material and silicon-and-germanium-containing material with the plasma effluents of the chlorine-containing precursor and the hydrogen-containing precursor.

20. The semiconductor processing method of claim 17, wherein the contacting is performed at a chamber operating temperature of less than or about −50° C.

* * * * *